(12) United States Patent
Lazic et al.

(10) Patent No.: US 10,573,488 B2
(45) Date of Patent: Feb. 25, 2020

(54) METHOD OF PERFORMING TOMOGRAPHIC IMAGING IN A CHARGED-PARTICLE MICROSCOPE

(71) Applicant: FEI Company, Hillsboro, OR (US)

(72) Inventors: Ivan Lazic, Eindhoven (NL); Eric Gerardus Theodoor Bosch, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/520,212

(22) Filed: Jul. 23, 2019

(65) Prior Publication Data

US 2019/0348254 A1 Nov. 14, 2019

Related U.S. Application Data

(63) Continuation of application No. 15/099,302, filed on Apr. 14, 2016, now Pat. No. 10,403,469.

(30) Foreign Application Priority Data

Apr. 15, 2015 (EP) .................................... 15163623

(51) Int. Cl.
*H01J 37/22* (2006.01)
*H01J 37/28* (2006.01)

(52) U.S. Cl.
CPC ............ *H01J 37/222* (2013.01); *H01J 37/28* (2013.01); *H01J 2237/2446* (2013.01);
(Continued)

(58) Field of Classification Search
CPC .......... H01J 37/20; H01J 37/28; H01J 37/222; H01J 2237/221; H01J 2237/226;
(Continued)

(56) References Cited

U.S. PATENT DOCUMENTS

| 2007/0194225 A1* | 8/2007 | Zorn | B82Y 35/00 250/306 |
| 2013/0037715 A1* | 2/2013 | Boughorbel | H01J 37/222 250/307 |
| 2013/0193322 A1* | 8/2013 | Blackburn | H01J 37/147 250/311 |

* cited by examiner

*Primary Examiner* — David E Smith
*Assistant Examiner* — Hsien C Tsai

(57) ABSTRACT

A method of performing sub-surface imaging of a specimen in a charged-particle microscope of a scanning transmission type, comprising the following steps:

Providing a beam of charged particles that is directed from a source along a particle-optical axis through an illuminator so as to irradiate the specimen;

Providing a detector for detecting a flux of charged particles traversing the specimen;

Causing said beam to follow a scan path across a surface of said specimen, and recording an output of said detector as a function of scan position, thereby acquiring a scanned charged-particle image I of the specimen;

Repeating this procedure for different members n of an integer sequence, by choosing a value $P_n$ of a variable beam parameter P and acquiring an associated scanned image $I_n$, thereby compiling a measurement set $M=\{(I_n, P_n)\}$;

Using computer processing apparatus to automatically deconvolve the measurement set M and spatially resolve it into a result set representing depth-resolved imagery of the specimen, wherein:

Said variable beam parameter P is focus position along said particle-optical axis;

Said scanned image I is an integrated vector field image, obtained by;

Embodying said detector to comprise a plurality of detection segments;

(Continued)

Combining signals from different detection segments so as to produce a vector output from the detector at each scan position, and compiling this data to yield a vector field;

Mathematically processing said vector field by subjecting it to a two-dimensional integration operation.

18 Claims, 3 Drawing Sheets

(52) U.S. Cl.
CPC ............ *H01J 2237/24495* (2013.01); *H01J 2237/2802* (2013.01); *H01J 2237/2815* (2013.01)

(58) Field of Classification Search
CPC ....... H01J 2237/2007; H01J 2237/2446; H01J 2237/2802; H01J 2237/2815
See application file for complete search history.

METHOD OF PERFORMING TOMOGRAPHIC IMAGING IN A CHARGED-PARTICLE MICROSCOPE

The invention relates to a method of performing sub-surface imaging of a specimen in a charged-particle microscope of a scanning transmission type, comprising the following steps:

Providing a beam of charged particles that is directed from a source along a particle-optical axis through an illuminator so as to irradiate the specimen;

Providing a detector for detecting a flux of charged particles traversing the specimen;

Causing said beam to follow a scan path across a surface of said specimen, and recording an output of said detector as a function of scan position, thereby acquiring a scanned charged-particle image/of the specimen;

Repeating this procedure for different members n of an integer sequence, by choosing a value $P_n$ of a variable beam parameter P and acquiring an associated scanned image $I_n$, thereby compiling a measurement set $M=\{(I_n, P_r)\}$;

Using computer processing apparatus to automatically deconvolve the measurement set M and spatially resolve it into a result set representing depth-resolved imagery of the specimen.

The invention also relates to a charged-particle microscope in which such a method can be performed.

Charged-particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" tools (e.g. a FIB-SEM), which additionally employ a "machining" Focused Ion Beam (FIB), allowing supportive activities such as ion-beam milling or Ion-Beam-Induced Deposition (IBID), for example. More specifically:

In a SEM, irradiation of a specimen by a scanning electron beam precipitates emanation of "auxiliary" radiation from the specimen, in the form of secondary electrons, backscattered electrons, X-rays and photoluminescence (infrared, visible and/or ultraviolet photons), for example; one or more components of this emanating radiation is/are then detected and used for image accumulation purposes, and/or spectroscopic analysis (as in the case of EDX (Energy-Dispersive X-Ray Spectroscopy), for example).

In a TEM, the electron beam used to irradiate the specimen is chosen to be of a high-enough energy to penetrate the specimen (which, to this end, will generally be thinner than in the case of a SEM specimen); the flux of transmitted electrons emanating from the specimen can then be used to create an image, or produce a spectrum (as in the case of EELS, for example; EELS=Electron Energy-Loss Spectroscopy). If such a TEM is operated in scanning mode (thus becoming a STEM), the image/spectrum in question will be accumulated during a scanning motion of the irradiating electron beam.

More information on some of the topics elucidated here can, for example, be gleaned from the following Wikipedia links:
http://en.wikipedia.org/wiki/Electron_microscope
http://en.wikipedia.org/wiki/Scanning_electron_microscope
http://en.wikipedia.org/wiki/Transmission_electron_microscopy
http://en.wikipedia.org/wiki/Scanning_transmission_electron_microscopy As an alternative to the use of electrons as irradiating beam, charged-particle microscopy can also be performed using other species of charged particle. In this respect, the phrase "charged particle" should be broadly interpreted as encompassing electrons, positive ions (e.g. Ga or He ions), negative ions, protons and positrons, for instance. As regards ion-based microscopy, some further information can, for example, be gleaned from sources such as the following:
http://en.wikipedia.org/wiki/Scanning_Helium_ion_Microscope
W. H. Escovitz, T. R. Fox and R. Levi-Setti, *Scanning Transmission Ion Microscope with a Field Ion Source*, Proc. Nat. Acad. Sci. USA 72(5), pp 1826-1828 (1975).
http://www.innovationmagazine.com/innovation/volumes/v7n1/coverstory3.shtml It should be noted that, in addition to imaging and/or spectroscopy, a charged-particle microscope (CPM) may also have other functionalities, such as examining diffractograms, performing (localized) surface modification (e.g. milling, etching, deposition), etc.

In all cases, a Scanning Transmission Charged-Particle Microscope (STORM) will comprise at least the following components:

A radiation source, such as a Schottky electron source or ion gun.

An illuminator, which serves to manipulate a "raw" radiation beam from the source and perform upon it certain operations such as focusing, aberration mitigation, cropping (with a stop/iris/condensing aperture), filtering, etc. It will generally comprise one or more charged-particle lenses, and may comprise other types of particle-optical component also. If desired, the illuminator can be provided with a deflector system that can be invoked to cause its output beam to perform a scanning motion across the specimen being investigated.

A specimen holder, on which a specimen under investigation can be held and positioned (e.g. tilted, rotated). If desired, this holder can be moved so as to effect a scanning motion of the beam w.r.t. the specimen. In general, such a specimen holder will be connected to a positioning system such as a mechanical stage.

An imaging system, which essentially takes charged particles that are transmitted through a specimen (plane) and directs (focuses) them onto analysis apparatus, such as a detection/imaging device, spectroscopic apparatus, etc. As with the illuminator referred to above, the imaging system may also perform other functions, such as aberration mitigation, cropping, filtering, etc., and it will generally comprise one or more charged-particle lenses and/or other types of particle-optical components.

A detector, which may be unitary or compound/distributed in nature, and which can take many different forms, depending on the radiation/entity being recorded. Such a detector may, for example, be used to register an intensity value, to capture an image, or to record a spectrum. Examples include photomultipliers (including solid-state photomultipliers, SSPMs), photodiodes, (pixelated) CMOS detectors, (pixelated) CCD detectors, photovoltaic cells, etc., which may, for example, be used in conjunction with a scintillator film, for instance. For X-ray detection, use is typically made of a so-called Silicon Drift Detector (SDD), or a Silicon Lithium (Si(Li)) detector, for example. Typically, an STORM will comprise several detectors, of various types.

In what follows, the invention may—by way of example—sometimes be set forth in the specific context of electron microscopy. However, such simplification is intended solely for clarity/illustrative purposes, and should not be interpreted as limiting.

An example of a method as set forth in the opening paragraph above is known from so-called HAADF-STEM tomography (HAADF=High-Angle Annular Dark Field), in which the beam parameter P is beam incidence angle (beam tilt) relative to (a plane of) the specimen, and in which the measurement set M is a so-called "tilt series" or "sinogram". See, for example, the following publication:

C. Kübel et al., *Recent advances in electron tomography: TEM and HAADF-STEM tomography for materials science and semiconductor applications*, Microscopy and Microanalysis November 2005, pp. 378-400:
http://www.researchgate.netipublication16349887_Recent_advances_in_electron_tomography_TEM_and_HAADF-STEM_tomography_for_materials_science_and_semiconductor_applications In this known technique, the deconvolution/spatial resolution ("reconstruction") of the set M can be performed using various mathematical tools. For example:

SIRT: Simultaneous Iterative Reconstruction Technique. See, for example:
  http://www.vcipt.org/pdfs/wcipt1/s2_1.pdf
  P. Gilbert, *Journal of Theoretical Biology*, Volume 36, Issue 1, July 1972, Pages 105-117.
DART: Discrete Algebraic Reconstruction Technique.
  See, for example: http://en.wikipedia.org/wiki/Algebraic_reconstruction_technique http://www.emat.ua.ac.be/pdf/1701.pdf, and references therein.
FST: Fourier Slice Theorem.
  See, for example, the book by A. C. Kak and Malcolm Slaney, *Principles of Computerized Tomographic Imaging*, IEEE Press, 1999; in particular, chapter 3, especially sections 3.2 and 3.3.
WBP (Weighted Back Projection) and POCS (Projection Onto Convex Sets), etc.

Although prior-art techniques such as set forth in the previous paragraph have produced tolerable results up to now, the current inventors have worked extensively to provide an innovative alternative to the conventional approach. The results of this endeavor are the subject of the current invention.

It is an object of the invention to provide a radically new method of investigating a specimen using an STCPM. In particular, it is an object of the invention that this method should allow sub-surface imaging of the specimen using alternative acquisition and processing techniques to those currently used.

These and other objects are achieved in a method as set forth in the opening paragraph above, which method is characterized in that:

Said variable beam parameter P is focus position (F) along said particle-optical axis;
Said scanned image I is an integrated vector field image, obtained by;
  Embodying said detector to comprise a plurality of detection segments;
  Combining signals from different detection segments so as to produce a vector output from the detector at each scan position, and compiling this data to yield a vector field;
  Mathematically processing said vector field by subjecting it to a two-dimensional integration operation.

The current invention makes use of integrated vector field (iVF) imaging, which is an innovative imaging technique set forth in co-pending European Patent Applications EP 14156356 and EP 15156053, and co-pending U.S. patent application Ser. No. 14/629,387 (filed Feb. 23, 2015)—which are incorporated herein by reference, and will be referred to hereunder as the "iVF documents". Apart from this difference in the nature of the employed image I, the invention also differs from the prior art in that the adjusted beam parameter P (which is (incrementally) changed so as to obtain the measurement set M) is axial focus position instead of beam tilt. Inter alia as a result of these differences—and various insights attendant thereto, which will be elucidated in greater detail below—the invention can make use of a different mathematical approach to perform depth-resolution on the measurement set M.

Of significant importance in the present invention is the insight that an iVF image is essentially a map of electrostatic potential $\varphi(x,y)$ in the specimen, whereas a HAADF-STEM image is a map of $\varphi^2(x,y)$ [see next paragraph also]. As a result of this key distinction, one can make use of a linear imaging model (and associated deconvolution techniques) in the present invention, whereas one cannot do this when using HAADF-STEM imagery. More specifically, this linearity allows image composition/deconvolution to be mathematically treated as a so-called Source Separation (SS) problem (e.g. a Blind Source Separation (BSS) problem), in which an acquired image is regarded as being a convolution of contributions from a collection of sub-sources distributed within the bulk of the specimen, and in which sub-source recovery can be achieved using a so-called Inverse Problem Solver; this contrasts significantly with HAADF-STEM tomography, in which image reconstruction is based on mathematics that rely on "line-of-sight" or "parallax" principles (based on so-called Radon Transforms). The SS approach is made possible because the aforementioned linearity implies minimal/negligible interference between said sub-sources, and it preserves phase/sign—which is lost when working with a quadratic entity such as $\varphi^2(x,y)$[as in HAADF-STEM]. Moreover, the irradiating charged-particle beam in an STORM can effectively be regarded as passing directly through the specimen, with negligible lateral spread (scattering); as a result, there will be relatively low loss of lateral resolution in an associated SS problem. Examples of mathematical techniques that can be used to solve an SS problem as alluded to here include, for example, Principal Component Analysis (PCA), Independent Component Analysis (ICA), Singular Value Decomposition (SVD) and Positive Matrix Formulation (PMF). More information with regard to SS techniques can, for example, be gleaned from:

[1] P. Comon and C. Jutten, *Handbook of Blind Source Separation: Independent Component Analysis and Applications*, Academic Press, 2010.
[2] A. Hyvärinen and E. Oja, *Independent Component Analysis: Algorithms and Applications*, Neural Networks, 13(4-5):411-430, 2000.
[3] I. T. Jolliffe, *Principal Component Analysis, Series*: Springer Series in Statistics XXIX, 2nd ed., Springer, NY, 2002.

At this point, it should be noted that the current invention is substantially different from the technique commonly referred to as "Confocal STEM" or "SCEM" (SCEM=Scanning Confocal Electron Microscopy). In this known technique:

One is not performing any imaging deconvolution. Instead, one is assuming that, for a given focus position within a specimen, all imaging information is produced within the corresponding focal plane (so-called "waist" of the incoming focused charged-particle beam/probe), with no significant contributions from overlying or underlying layers. Consequently, for each employed focus setting, there is no mixing/degeneration/convolution of imaging information from a stack of co-contributing layers, and thus no associated deconvolution/disentanglement problem.

Considering a single layer of the specimen (thinner than the beam waist), one is not imaging $\varphi(x,y)$ (since one is not using iVF imagery), but one is instead imaging a complicated nonlinear function of $\varphi(x,y)$. More specifically, the image formation process in SCEM is given by the expression:

$$I^{SCEM}(\vec{r}_p) = |(\psi_{in}^{L1}(-\vec{r})\psi_{in}^{L2}(\vec{r}) * e^{i\varphi(\vec{r})})(\vec{r}_p)|_2$$

wherein:

$\psi_{in}^{L1}$ and $\psi_{in}^{L2}(\vec{r})$ are wave functions respectively associated with the condenser lens (illuminator) and projection lens (imaging system);

$\psi_{in}^{L1}(-\vec{r})$ describes the probe (irradiating charged-particle beam) impinging upon the specimen;

I represents intensity and $\vec{r}_p$ denotes scanning coordinate/probe position;

The "*" operator indicates a convolution.

In contrast, in the present invention (with iVF imaging), one instead obtains:

$$I^{iVF}(\vec{r}_p) = \frac{1}{2\pi}\left(|\psi_{in}(\vec{r})|^2 \star \varphi(\vec{r})\right)(\vec{r}_p)$$

in which the "*" operator indicates a cross-correlation, and in which linear dependence on $\varphi(\vec{r})$ is immediately evident. For good order (and purposes of comparison), the imaging situation in a HAADF-STEM is given by:

$$I^{HAADF-STEM}(\vec{r}_p) = C_{HAADF}(|\psi_{in}(\vec{r})|^2 * \varphi^2(\vec{r}))(\vec{r}_p)$$

where $C_{HAADF}$ is a constant whose value depends on particulars of the employed detector configuration, and "*" again indicates a cross-correlation. It is clear that, in this technique, imaging is a function of $\varphi^2(\vec{r})$ [as already stated above].

One needs to make use of a special type of detector, viz. a so-called pinhole detector. The reason such a detector is necessary is to simplify the imaging mathematics, by allowing a rather complicated (generic) "window function" to be replaced by a much simpler (specific) Dirac delta function (this simplification has already been processed in the mathematics set forth in the previous item). Such a pinhole detector needs to be carefully manufactured (to have a well-defined, sufficiently small pinhole) and kept properly aligned with the imaging beam, thus introducing extra complications relative to the present invention.

For purposes of completeness, it is noted that the "iVF documents" referred to above inter alia make it clear that:

To obtain iVF imagery, the detector in the current invention may, for example, be a four-quadrant detector, pixelated detector or Position-sensitive Detector (PSD), for instance.

To obtain iVF imagery, the vector(ized) output from such a detector will be subjected to a two-dimensional integration operation (e.g. Vector Field Integration or Gradient Field Integration), thus yielding a scalar image.

If desired, a "raw" iVF image can be post-processed, e.g. by applying high-, low- or band-pass filtering, Opening Angle Correction (OAC), or deconvolution correction, for instance, thus obtaining a so-called PiVF image.

If desired, one can apply a Laplacian operator to an iVF or PiVF image, thus yielding so-called LiVF or LPiVF images, respectively.

Any such iVF, PiVF, LiVF or LPiVF image is considered as falling within the scope of the "integrated vector field image i" of the current invention.

In a particular embodiment of the current invention, an approach is adopted wherein:

The specimen is conceptually sub-divided into a (depth) series $[S_1, \ldots, S_m]$ of m slices disposed along and normal to said particle-optical axis;

For each value of n, the corresponding image is expressed as a linear sum $$\sum_{j=1}^{j=m} i_n(S_j)$$

of discrete sub-images, each associated with a different one of said slices.

For example, in a particular instance of such an embodiment, RCA is applied to a set of m spatially aligned (and, if necessary, scaled) iVF images acquired at different/incremental focus values. After mean-centering each image and applying RCA, one obtains a set of m de-correlated images that are related to the input ones by linear transformations (i.e. each input image can be expressed as a linear combination of these de-correlated images). The linear mappings can be obtained using various suitable methods, such as a so-called Karhunen-Loève Transform, for example. New information in iVF images acquired at increasingly deeper focus is mostly due to signals coming from new depth layers reached by the incident charged-particle beam; the effect of RCA de-correlation thus results in the effective separation of the different depth layers. The inventors observed that sets of images with lower Eigenvalues in a Karhunen-Loève Transform correspond to deeper layers. In the image associated with these deeper components, top layers are canceled using information from all available shallower-focus images. Based on these observations, one can develop an exemplary algorithm that uses m input images, as follows:

Step 1: Acquire in iVF images at increasingly deep focal levels (focus series).

Step 2: Laterally align and/or scale the image sequence thus obtained.

Step 3: To compute (distil) the image associated with a discrete layer (level) of ordinal k counted from the specimen surface (k=1 . . . m):

Apply RCA decomposition to the first k images in the sequence.

Boost independent components having low weight (which emanate from deeper layers); this can, for example, be done by multiplying such components by a weighting factor that is equal or proportional to the reciprocal of their RCA (e.g. Karhunen-Loève) Eigenvalue.

Reconstruct a depth image with re-weighted independent components (including, for example, a background (matrix or bulk) component).

Step 4: Post-process the obtained sequence using de-noising and restoration methods.

Using such an approach, the relative thickness of the computed slices (layers/levels) can be adjusted by suitable choice of the focus increments applied during acquisition of the focus series. This can result in very high depth resolution in many applications. Although the example just given makes specific use of RCA, one could also solve this problem using ICA or another SS technique. For more information on the above-mentioned Karhunen-Loève Transform, see, for example:

http://en.wikipedia.org/wiki/Karhunen%E2%80%93Lo%C3%A8ve_theorem

In a variant/special case of the embodiment set forth in the previous paragraph, the following applies:

For each given focus value $P_n$, a particular slice $S_{Bn}$ is associated with a position of best focus within the specimen;

$i_n(S_j)$ is set to zero for each integer $j \neq Bn$, so that $I_n$ is taken to derive solely from $S_{Bn}$.

In this embodiment, one is essentially assuming that a relatively large fraction of the imaging information is originating from the plane of best focus of the impinging charged-particle beam, to the extent that one chooses to ignore contributions coming from outside that plane. When viewed in longitudinal cross-section within the specimen, such a beam has a (quasi-) hourglass shape, with a relatively narrow "waist" (or beam cross-over) in its middle. The charged-particle intensity (energy per unit area) in this waist region will be maximal compared to the rest of the beam cross-section, and what the current embodiment essentially assumes is that imagery from this high-intensity waist will overwhelm any imagery contributions coming from outside the waist. The inventors have observed that this is a reasonable assumption to make when, for example, the beam has a relatively large opening angle (~numerical aperture), in which case the abovementioned hourglass will have relatively broad (and, thus, low-intensity) "shoulders and hips" compared to its waist. For example, an opening angle in a range greater than about 20 mrad could be expected to give this effect.

In the context of the present invention, the set $\{P_n\}$ ($=\{F_n\}$) can be referred to as a "focus series" (as already alluded to above). The skilled artisan will understand that the cardinality of this set, and the (incremental) separation of its elements, are matters of choice, which can be tailored at will to suit the particulars of a given situation. In general, a larger cardinality/closer spacing of elements can lead to higher deconvolution resolution, but will generally incur a throughput penalty. In a typical instance, one might, for example, employ a cardinality of the order of about 20, with focus increments of the order of about 5 nm; such values are exemplary only, and should not be construed as limiting.

The invention will now be elucidated in more detail on the basis of exemplary embodiments and the accompanying schematic drawings, in which:

FIG. 1 renders a longitudinal cross-sectional elevation of an STORM in which an embodiment of the current invention can be carried out.

EMBODIMENT 1

Figure 1:
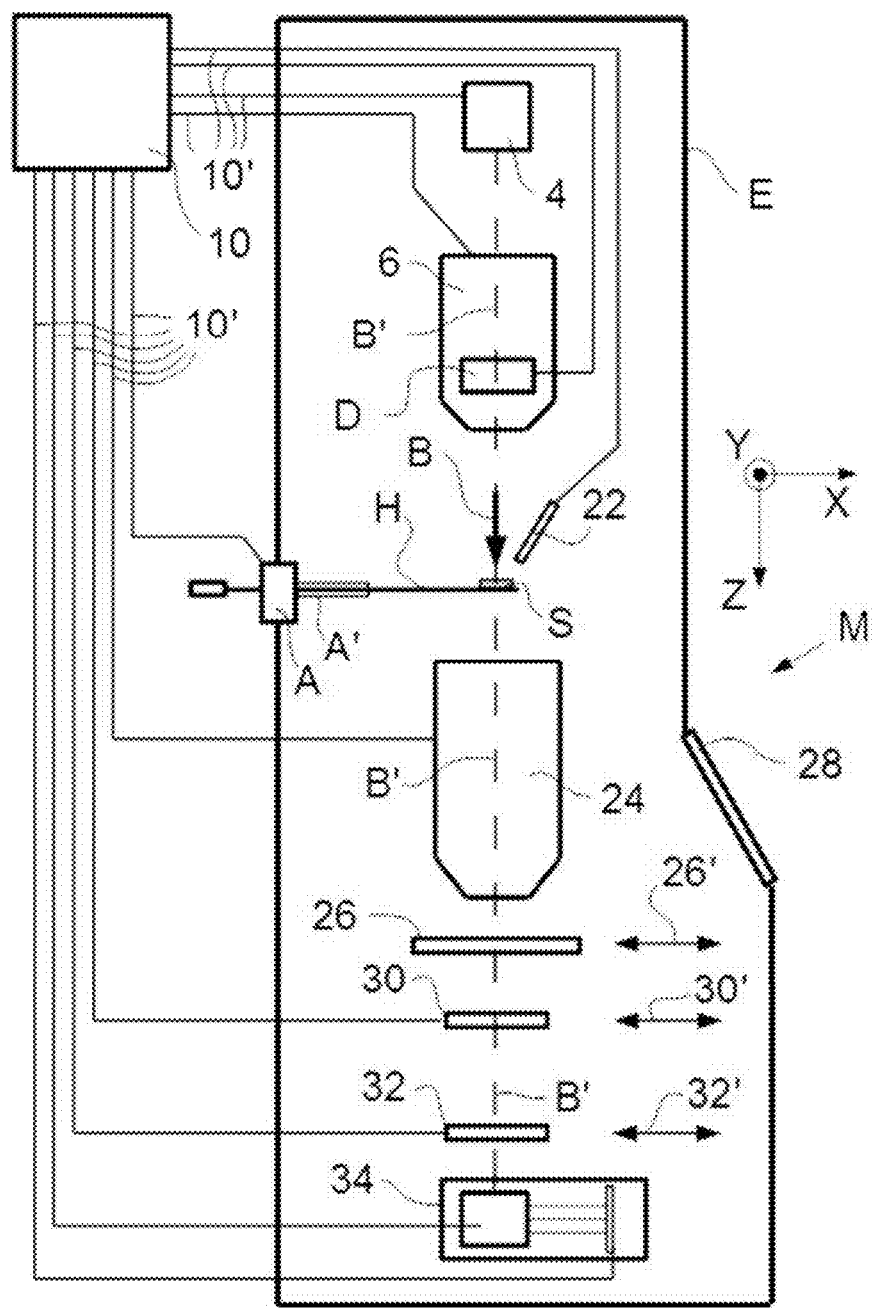

FIG. 1 is a highly schematic depiction of an embodiment of a STCPM M according to the current invention, which, in this case, is a (S)TEM (though, in the context of the current invention, it could just as validly be an ion-based or proton microscope, for example). In the Figure, within a vacuum enclosure E, an electron source 4 (such as a Schottky emitter, for example) produces a beam (B) of electrons that traverse an electron-optical illuminator 6, serving to direct/focus them onto a chosen part of a specimen S (which may, for example, be (locally) thinned/planarized). This illuminator 6 has an electron-optical axis B', and will generally comprise a variety of electrostatic/magnetic lenses, (scan) deflector(s) D, correctors (such as stigmators), etc.; typically, it can also comprise a condenser system (in fact, the whole of item 6 is sometimes referred to as "a condenser system").

The specimen S is held on a specimen holder H. As here illustrated, part of this holder H (inside enclosure E) is mounted in a cradle A' that can be positioned/moved in multiple degrees of freedom by a positioning device (stage) A; for example, the cradle A' may (inter alia) be displaceable in the X, Y and Z directions (see the depicted Cartesian coordinate system), and may be rotated about a longitudinal axis parallel to X. Such movement allows different parts of the specimen S to be irradiated/imaged/inspected by the electron beam traveling along axis B' (and/or allows scanning motion to be performed as an alternative to beam scanning [using deflector(s) D], and/or allows selected parts of the specimen S to be machined by a (non-depicted) focused ion beam, for example).

The (focused) electron beam B traveling along axis B' will interact with the specimen S in such a manner as to cause various types of "stimulated" radiation to emanate from the specimen S, including (for example) secondary electrons, backscattered electrons, X-rays and optical radiation (cathodoluminescence). If desired, one or more of these radiation types can be detected with the aid of sensor 22, which might be a combined scintillator/photomultiplier or EDX (Energy-Dispersive X-Ray Spectroscopy) module, for instance; in such a case, an image could be constructed using basically the same principle as in a SEM. However, of principal importance in a (S)TEM, one can instead/supplementally study electrons that traverse (pass through) the specimen 5, emerge (emanate) from it and continue to propagate (substantially, though generally with some deflection/scattering) along axis B'. Such a transmitted electron flux enters an imaging system (combined objective/projection lens) 24, which will generally comprise a variety of electrostatic/magnetic lenses, deflectors, correctors (such as stigmators), etc. In normal (non-scanning) TEM mode, this imaging system 24 can focus the transmitted electron flux onto a fluorescent screen 26, which, if desired, can be retracted/withdrawn (as schematically indicated by arrows 26') so as to get it out of the way of axis B'. An image (or diffractogram) of (part of) the specimen S will be formed by imaging system 24 on screen 26, and this may be viewed through viewing port 28 located in a suitable part of a wall of enclosure E. The retraction mechanism for screen 26 may, for example, be mechanical and/or electrical in nature, and is not depicted here.

As an alternative to viewing an image on screen 26, one can instead make use of the fact that the depth of focus of the electron flux emerging from imaging system 24 is generally quite large (e.g. of the order of 1 meter). Consequently, various types of sensing device/analysis apparatus can be used downstream of screen 26, such as:

TEM camera 30. At camera 30, the electron flux can form a static image (or diffractogram) that can be processed by controller 10 and displayed on a display device (not depicted), such as a flat panel display, for example. When not required, camera 30 can be retracted/withdrawn (as schematically indicated by arrows 30') so as to get it out of the way of axis B'.

STEM detector 32. An output from detector 32 can be recorded as a function of (X,Y) scanning position of the beam B on the specimen 5, and an image can be constructed that is a "map" of output from detector 32 as a function of X,Y. Typically, detector 32 will have a much higher acquisition rate (e.g. $10^6$ points per second) than camera 30 (e.g. $10^2$ images per second). In conventional tools, detector 32 can comprise a single pixel with a diameter of e.g. 20 mm, as opposed to the matrix of pixels characteristically present in camera 30; however, in the context of the present invention, detector 32 will have a different structure (see below), so as to allow iVF imaging to be performed. Once again, when not required, detector 32 can be retracted/withdrawn (as schematically indicated by arrows 32') so as to get it out of the way of axis B' (although such retraction would not be a necessity in the case of a donut-shaped annular dark field detector 32, for example; in such a detector, a central hole would allow beam passage when the detector was not in use).

As an alternative to imaging using camera 30 or detector 32, one can also invoke spectroscopic apparatus 34, which could be an EELS module, for example.

It should be noted that the order/location of items 30, 32 and 34 is not strict, and many possible variations are conceivable. For example, spectroscopic apparatus 34 can also be integrated into the imaging system 24.

Note that the controller/computer processor 10 is connected to various illustrated components via control lines (buses) 10'. This controller 10 can provide a variety of functions, such as synchronizing actions, providing setpoints, processing signals, performing calculations, and displaying messages/information on a display device (not depicted). Needless to say, the (schematically depicted) controller 10 may be (partially) inside or outside the enclosure E, and may have a unitary or composite structure, as desired. The skilled artisan will understand that the interior of the enclosure E does not have to be kept at a strict vacuum; for example, in a so-called "Environmental (S)TEM", a background atmosphere of a given gas is deliberately introduced/maintained within the enclosure E. The skilled artisan will also understand that, in practice, it may be advantageous to confine the volume of enclosure E so that, where possible, it essentially hugs the axis B', taking the form of a small tube (e.g. of the order of 1 cm in diameter) through which the employed electron beam passes, but widening out to accommodate structures such as the source 4, specimen holder H, screen 26, camera 30, detector 32, spectroscopic apparatus 34, etc.

In the context of the current invention, the following specific points deserve further elucidation:

The detector 32 is embodied as a segmented detector, which, for example, may be a quadrant sensor, pixelated CMOS/CCD/SSPM detector, or PSD, for instance. Specific embodiments of such detectors are shown in plan view in FIGS. 2 and 3, and will be discussed below.

Figure 2:
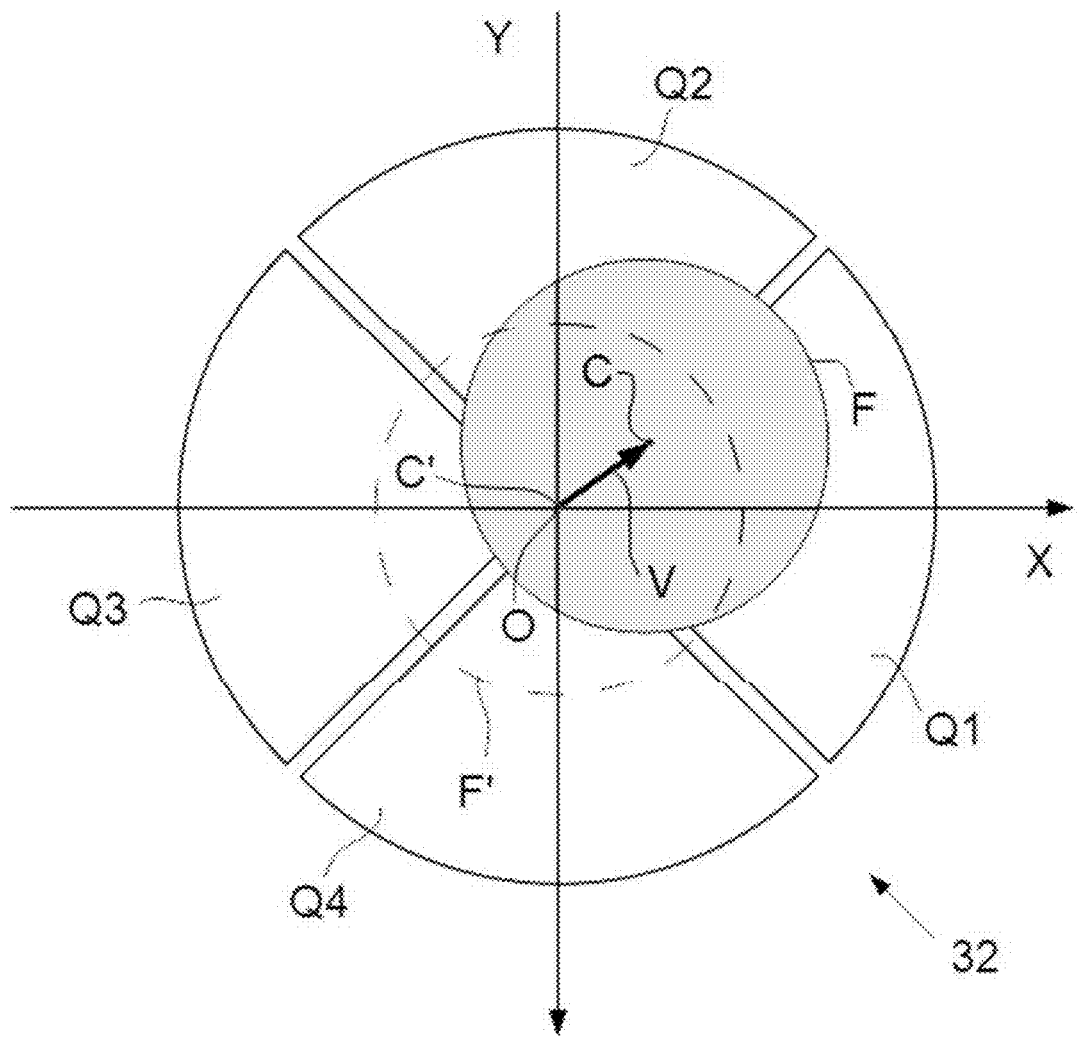
FIG. 2 depicts a plan view of a particular embodiment of a segmented detector (quadrant detector) that can be used in the subject of FIG. 1, in accordance with the current invention.

If a charged-particle beam propagating along the particle-optical axis B' traverses the specimen S without undergoing any scattering/deflection in the specimen, then it will impinge (substantially) symmetrically on the center/origin O of the detector 32, and (essentially) give a "null" reading. This situation is shown in more detail in FIGS. 2 and 3, which show Cartesian axes X, Y with an origin at point O, on which is centered a dashed circle that schematically represents an impingement footprint F' of a (ghost) charged-particle beam with barycenter C', such that:

In FIG. 2, this footprint F' is symmetrically overlaid on detection quadrants (electrodes) Q1, Q2, Q3, Q4. If the detection signals (electrical currents) from these quadrants are respectively denoted by S1, S2, S3, S4, then this situation will yield zero difference signals S1-S3 and S2-S4 between opposing pairs of quadrants.

Figure 3:
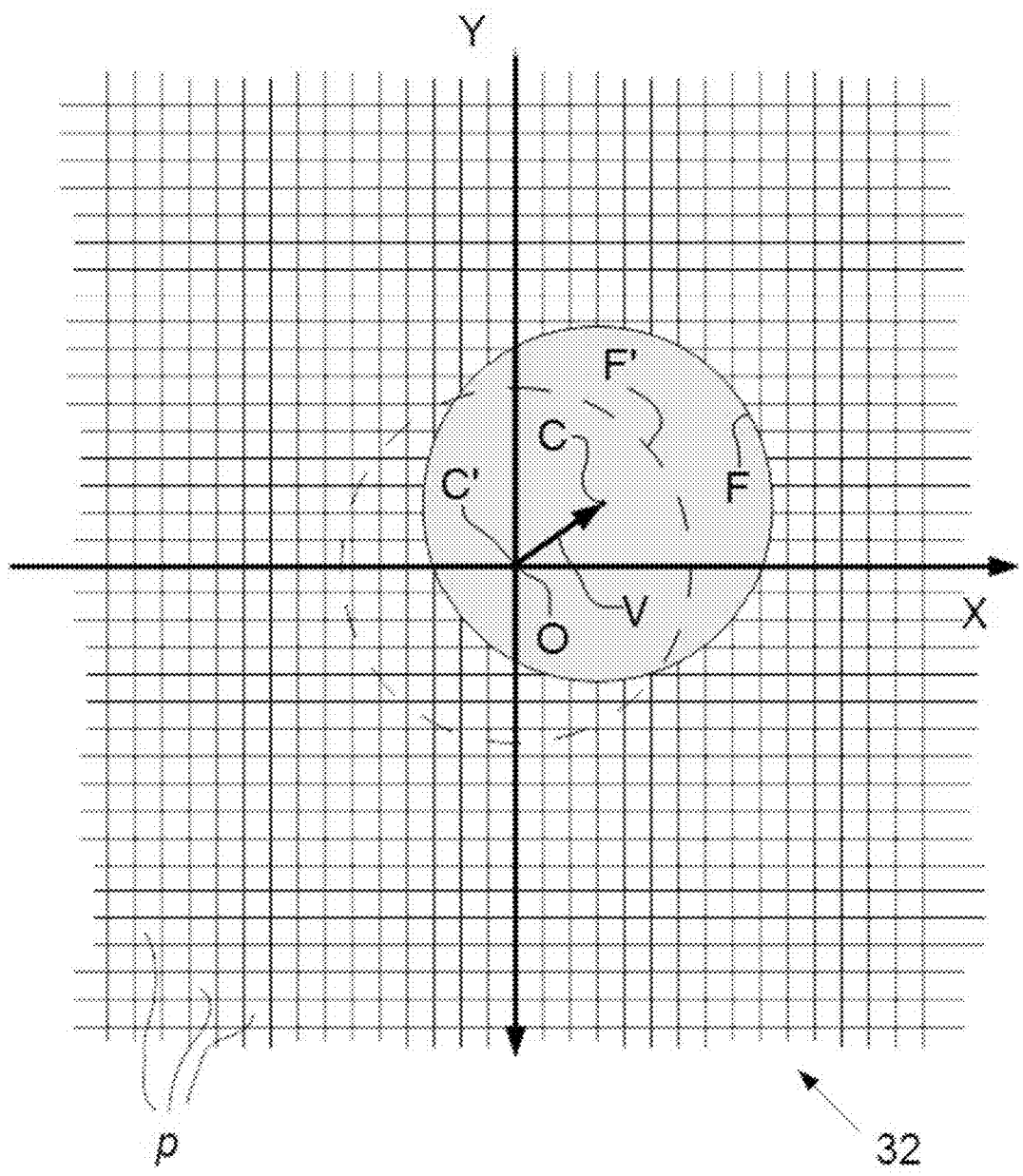
FIG. 3 depicts a plan view of another embodiment of a segmented detector (pixelated detector) that can be used in the subject of FIG. 1, in accordance with the current invention.

In FIG. 3, which depicts an orthogonal matrix of detection pixels p (e.g. in a CMOS detector, possibly with an overlaid scintillation layer), there is zero deviation between the elected origin O of said pixel matrix and barycenter If, on the other hand, a charged-particle beam undergoes some scattering/deflection in the specimen S, it will land on the detector 32 at a position displaced from the origin O. In this context, FIGS. 2 and 3 show a beam footprint F with barycenter C that is no longer centered on O. The position of point C with respect to O defines a vector V, with an associated magnitude (length) and direction (pointing angle with respect to X axis, for example). This vector V can be expressed in terms of the coordinates ($X_C$, $Y_C$) of point C, which can be distilled as follows:

In FIG. 2, one can derive (rudimentary) estimators for $X_C$, $Y_C$ using the following formulae:

$$X_C \sim \frac{S1-S3}{S1+S2+S3+S4}, Y_C \sim \frac{S2-S4}{S1+S2+S3+S4} \quad (1)$$

In FIG. 3, one can derive values for $X_C$, $Y_C$ by examining output signals from the various pixels p, because pixels p that are impinged upon by the beam footprint F will give a different output signal (electrical resistance, voltage or current, for example) to pixels p outside the footprint F. The location of C can then be directly deduced by noting the coordinates of that particular pixel that yields an extremal signal, or indirectly determined by mathematically calculating the barycenter of the cluster of pixels p impinged on by F, or via a hybrid technique that combines both approaches, for example.

The skilled artisan will understand that the size of beam footprint F can be altered by adjusting the so-called "camera length" of the STORM of FIG. 1, for example.

As the input charged-particle beam B is scanned across the specimen S so as to trace out a two-dimensional scan path (area), the approach set forth in the previous item can be used to obtain a value of V for each coordinate position along said scan path. This allows compilation of a "map" of vector V as a function of scan position on the specimen 5, which amounts to a mathematical field (and also a physical field, in that the vector V can be assigned a (proportional) physical meaning, such as electrostatic field vector).

The vector field resulting from the previous step can now be integrated two-dimensionally, so as to obtain an integrated vector field (iVF) image that is intrinsic to the current invention. This aspect of the invention will be elucidated in more detail in the next Embodiment (which again makes specific reference to (S)TEM, but is equally applicable to a generic STORM).

In accordance with the present invention, such an iVF image is obtained at each of a series $\{F_n\}$ of different focus values (focus position being the beam parameter P that, in accordance with the current invention, is selected to be varied so as to obtain input data pairs for the ensuing mathematical deconvolution procedure; this contrasts with HAADF-STEM tomography, for example, where the varied parameter P is chosen to be beam tilt). Focus value may, for example, be varied by:

Changing a (focus) setting of (at least one of) the particle-optical components in illuminator 6; and/or
Changing a Z position of specimen holder H.

In this way, one accrues a measurement set $M=\{(I_n, P_n)\}=\{(I_n, F_n)\}$, in which $I_n$ is the iVF image corresponding to a given focus value $F_n$. According to the invention, this measurement set M can then be (automatically) deconvolved/spatially resolved into a (tomographic) result set representing depth-resolved/depth-reconstructed imagery of the specimen, e.g. using SS mathematical techniques as set forth above. See, in this regard, Embodiments 3 and 4 below.

EMBODIMENT 2

A further explanation will now be given regarding some of the mathematical techniques that can be used to obtain an iVF image as employed in the present invention.

Integrating Gradient Fields

As set forth above, a measured vector field $\tilde{E}(x,y)=(\tilde{E}_x(x,y),\tilde{E}_y(x,y))^T$ can (for example) be derived at each coordinate point (x,y) from detector segment differences using the expressions:

$$\tilde{E}_x = \frac{S_1 - S_3}{S_1 + S_2 + S_3 + S_4} \quad (2a)$$

$$\tilde{E}_y = \frac{S_2 - S_4}{S_1 + S_2 + S_3 + S_4} \quad (2b)$$

where, for simplicity, spatial indexing (x,y) in the scalar fields $\tilde{E}_x, \tilde{E}_y$ and $S_{i=1,\ldots,4}$ has been omitted, and where superscript T denotes the transpose of a matrix.

It is known from the theory of (S)TEM contrast formation that $\tilde{E}$ is a measurement of the actual electric field E in an area of interest of the imaged specimen. This measurement is inevitably corrupted by noise and distortions caused by imperfections in optics, detectors, electronics, etc. From basic electromagnetism, it is known that the electrostatic potential function $\varphi(x,y)$ [also referred to below as the potential map] is related to the electric field by:

$$E = -\nabla\varphi \quad (3)$$

The goal here is to obtain the potential map at each scanned location of the specimen. But the measured electric field in its noisy form $\tilde{E}$ will most likely not be "integrable", i.e. cannot be derived from a smooth potential function by the gradient operator. The search for an estimate $\hat{\varphi}$ of the potential map given the noisy measurements $\tilde{E}$ can be formulated as a fitting problem, resulting in the functional minimization of objective function J defined as:

$$J(\varphi)=\iint\|(-\nabla\varphi)-\tilde{E}\|^2 dxdy=\iint\|\nabla\varphi+\tilde{E}\|^2 dxdy \quad (4)$$

where $$\nabla\varphi = (\varphi_x, \varphi_y)^T = \left(\frac{\partial\varphi}{\partial x}, \frac{\partial\varphi}{\partial y}\right)^T.$$

One is essentially looking for the closest fit to the measurements, in the least squares sense, of gradient fields derived from smooth potential functions $\varphi$.

To be at the sought minimum of J one must satisfy the Euler-Lagrange equation:

$$\frac{\partial\|\nabla\varphi+\tilde{E}\|^2}{\partial\varphi} - \frac{d}{dx}\frac{\partial\|\nabla\varphi+\tilde{E}\|^2}{\partial\varphi_x} - \frac{d}{dy}\frac{\partial\|\nabla\varphi+\tilde{E}\|^2}{\partial\varphi_y} = 0 \quad (5)$$

which can be expanded to:

$$-\frac{d}{dx}\frac{\partial\left[(\varphi_x+\tilde{E}_x)^2+(\varphi_y+\tilde{E}_y)^2\right]}{\partial\varphi_x} - \frac{d}{dy}\frac{\partial\left[(\varphi_x+\tilde{E}_x)^2+(\varphi_y+\tilde{E}_y)^2\right]}{\partial\varphi_y} = 0 \quad (6)$$

finally resulting in:

$$\frac{\partial^2\varphi}{\partial x^2} + \frac{\partial^2\varphi}{\partial y^2} = -\left(\frac{\partial\tilde{E}_x}{\partial x} + \frac{\partial\tilde{E}_y}{\partial y}\right) \quad (7)$$

which is the Poisson equation that one needs to solve to obtain $\hat{\varphi}$.

Poisson Solvers

Using finite differences for the derivatives in (7) one obtains:

$$\frac{\varphi_{i+1,j}-2\varphi_{i,j}+\varphi_{i-1,j}}{\Delta^2} + \frac{\varphi_{i,j+1}-2\varphi_{i,j}+\varphi_{i,j-1}}{\Delta^2} = \\ -\left(\frac{(\tilde{E}_x)_{i+1,j}-(\tilde{E}_x)_{i-1,j}}{\Delta} + \frac{(\tilde{E}_y)_{i,j+1}-(\tilde{E}_y)_{i,j-1}}{\Delta}\right) \quad (8)$$

where $\Delta$ is the so-called grid step size (assumed here to be equal in the x and y directions). The right side quantity in (8) is known from measurements and will be lumped together in a term $\rho_{i,j}$ to simplify notation:

$$\frac{\varphi_{i+1,j}-2\varphi_{i,j}+\varphi_{i-1,j}}{\Delta^2} + \frac{\varphi_{i,j+1}-2\varphi_{i,j}+\varphi_{i,j-1}}{\Delta^2} = \rho_{i,j} \quad (9)$$

which, after rearranging, results in:

$$\varphi_{i-1,j}+\varphi_{i,j-1}-4\varphi_{i,j}+\varphi_{i,j+1}\varphi_{i+1,j}=\Delta^2\rho_{i,j} \quad (10)$$

for i=2, ..., N−1 and j=2, ..., M−1, with (N,M) the dimensions of the image to be reconstructed.

The system in (10) leads to the matrix formulation:

$$L\phi = \rho \quad (11)$$

where $\phi$ and $\rho$ represent the vector form of the potential map and measurements, respectively (the size of these vectors is N×M, which is the size of the image). The so-called Laplacian matrix L is of dimensions (N×M)$^2$ but is highly sparse and has a special form called "tridiagonal with fringes" for the discretization scheme used above. So-called Dirichlet and Neumann boundary conditions are commonly used to fix the values of $\hat{\varphi}$ at the edges of the potential map.

The linear system of (11) tends to be very large for typical (S)TEM images, and will generally be solved using numerical methods, such as the bi-conjugate gradient method. Similar approaches have previously been used in topography reconstruction problems, as discussed, for example, in the journal article by Ruggero Pintus, Simona Podda and Massimo Vanzi, 14$^{th}$ *European Microscopy Congress*, Aachen, Germany, pp. 597-598, Springer (2008).

One should note that other forms of discretization of the derivatives can be used in the previously described approach, and that the overall technique is conventionally known as the Poisson solver method. A specific example of such a method is the so-called multi-grid Poisson solver, which is optimized to numerically solve the Poisson equation starting from a coarse mesh/grid and proceeding to a finer mesh/grid, thus increasing integration speed.

Basis Function Reconstruction

Another approach to solving (7) is to use the so-called Frankot-Chellapa algorithm, which was previously employed for depth reconstruction from photometric stereo images. Adapting this method to the current problem, one can reconstruct the potential map by projecting the derivatives into the space-integrable Fourier basis functions. In practice, this is done by applying the Fourier Transform FT(·) to both sides of (7) to obtain:

$$(\omega_x^2 + \omega_y^2)FT(\varphi) = -\sqrt{-1}(\omega_x FT(\tilde{E}_x) + \omega_y FT(\tilde{E}_y)) \quad (12)$$

from which $\hat{\varphi}$ can be obtained by Inverse Fourier Transform (IFT):

$$\hat{\varphi} = IFT\left(-\sqrt{-1}\frac{\omega_x FT(\tilde{E}_x) + \omega_y FT(\tilde{E}_y)}{\omega_x^2 + \omega_y^2}\right) \quad (13)$$

The forward and inverse transforms can be implemented using the so-called Discrete Fourier Transform (DFT), in which case the assumed boundary conditions are periodic. Alternatively, one can use the so-called Discrete Sine Transform (DST), which corresponds to the use of the Dirichlet boundary condition ($\varphi$=0 at the boundary). One can also use the so-called Discrete Cosine Transform (DCT), corresponding to the use of the Neumann boundary conditions ($\nabla\varphi \cdot n$=0 at the boundary, n being the normal vector at the given boundary location). Generalizations and improved Solutions While working generally well, the Poisson solver and Basis Function techniques can be enhanced further by methods that take into account sharp discontinuities in the data (outliers). For that purpose, the objective function J can be modified to incorporate a different residula error R (in (4), the residual error was R(v)=||v||$^2$). One can for example use exponents of less than two including so-called Lp norm-based objective functions:

$$J(\varphi) = \int\int R(-\nabla\varphi, \tilde{E})dxdy = \int\int \|(-\nabla\varphi) - \tilde{E}\|^{\frac{1}{p}} dxdy, \; p \geq 1 \quad (14)$$

The residual can also be chosen from the set of functions typically used in so-called M- estimators (a commonly used class of robust estimators). In this case, R can be chosen from among functions such as so-called Huber, Cauchy, and Tuckey functions. Again, the desired result from the modification of the objective function will be to avoid overly smooth reconstructions and to account more accurately for real/physical discontinuities in the datasets. Another way of achieving this is to use anisotropic weighting functions $w_x$ and $$J(\varphi) = \iint w_x(\epsilon_x^{k-1})(-\varphi_x - \tilde{E}_x)^2 + w_y(\epsilon_y^{k-1})(-\varphi_y - \tilde{E}_y)^2 dxdy \quad (15)$$

where the weight functions depend on the residuals:

$$R(\epsilon_x^{k-1}) = R(-\varphi_x^{k-1}, \tilde{E}_x) \text{ and } R(\epsilon h d\; y^{k-1}) = R(-\varphi_y^{k-1}, \tilde{E}_y) \quad (15a)$$

at iteration k-1.

It can be shown that, for the problem of depth reconstruction from photometric stereo images, the use of such anisotropic weights, which can be either binary or continuous, leads to improved results in the depth map recovery process. In another approach, one can also apply a diffusion tensor D to the vector fields $\nabla\varphi$ and $\tilde{E}$ with the aim of smoothing the data while preserving discontinuities during the process of solving for $\hat{\varphi}$ suiting in the modification of (4) into:

$$J(\varphi) = \iint \|D(-\nabla\varphi) - D(\tilde{E})\|^2 dxdy \quad (16)$$

Finally, regularization techniques can be used to restrict the solution space. This is generally done by adding penalty functions in the formulation of the objective criterion J such as follows:

$$J(\varphi) = \iint [\|(-\nabla\varphi) - \tilde{E}\|^2 + \lambda f(\nabla\varphi)] dxdy \quad (17)$$

The regularization function $f(\nabla\varphi)$ can be used to impose a variety of constraints on $\varphi$ for the purpose of stabilizing the convergence of the iterative solution. It can also be used to incorporate into the optimization process prior knowledge about the sought potential field or other specimen/imaging conditions.

Position Sensitive Detector (PSD)

Using a Position Sensitive Detector (PSD) and measuring a thin, non-magnetic specimen, one obtains (by definition) the vector field image components as components of the center of mass (COM) of the electron intensity distribution $I_D(\vec{k}, \vec{r}_p)$ at the detector plane:

$$I_x^{COM}(\vec{r}_p) = \int\int_{-\infty}^{\infty} k_x I_D(\vec{k}, \vec{r}_p) d^2\vec{k} \quad (18)$$

$$I_y^{COM}(\vec{r}_p) = \int\int_{-\infty}^{\infty} k_y I_D(\vec{k}, \vec{r}_p) d^2\vec{k}$$

where $\vec{r}_p$ represents position of the probe (focused electron beam) impinging upon the specimen, and $\vec{k} = (k_x, k_y)$ are coordinates in the detector plane. The full vector field image can then be formed as:

$$\vec{I}^{COM}(\vec{r}_p) = I_x^{COM}(\vec{r}_p) \cdot \vec{x}_0 + I_y^{COM}(\vec{r}_p) \cdot \vec{y}_0 \quad (19)$$

where $\vec{x}_0$ and $\vec{y}_0$ are unit vectors in two perpendicular directions.

The electron intensity distribution at the detector is given by:

$$I_D(\vec{k},\vec{r}_p) = |\mathcal{F}\{\psi_{in}(\vec{r}-\vec{r}_p)e^{i\varphi(\vec{r})}\}(\vec{k})|^2 \quad (20)$$

where $\psi_{in}(\vec{r}-\vec{r}_p)$ is the impinging electron wave (i.e. the probe) illuminating the specimen at position $\vec{r}_p$, and $e^{i\varphi(\vec{r})}$ is the transmission function of the specimen. The phase $\varphi(\vec{r})$ is proportional to the specimen's inner electrostatic potential field. Imaging $\varphi(\vec{r})$ is the ultimate goal of any electron microscopy imaging technique. Expression (19) can be re-written as:

$$\overrightarrow{I^{COM}}(\vec{r}_p) = \frac{1}{2\pi}(|\psi_{in}(\vec{r})|^2 \star \nabla\varphi(\vec{r}))(\vec{r}_p) = -\frac{1}{2\pi}(|\psi_{in}(\vec{r})|^2 \star \vec{E}(\vec{r}))(\vec{r}_p) \quad (21)$$

where $\vec{E}(\vec{r})=-\nabla\varphi(\vec{r})$ is the inner electric field of the specimen which is the negative gradient of the electrostatic potential field of the specimen—and the operator "$\star$" denotes cross-correlation. It is evident that the obtained vector field image $\overrightarrow{I^{COM}}(\vec{r}_p)$ directly represents the inner electric field $\vec{E}(\vec{r})$ of the specimen. Its components are set forth in (18) above. Next, an integration step in accordance with the current invention is performed, as follows:

$$I^{ICOM}(\vec{r}_p) = \int_{l=\vec{r}_{ref}}^{\vec{r}_p} \overrightarrow{I^{COM}}(\vec{r}) \cdot d\vec{l} \quad (22)$$

using any arbitrary path l. This arbitrary path is allowed because, in the case of non-magnetic specimens, the only field is the electric field, which is a conservative vector field. Numerically this can be performed in many ways (see above). Analytically it can be worked out by introducing (21) into (22), yielding:

$$I^{ICOM}(\vec{r}_p) = \frac{1}{2\pi}(|\psi_{in}(\vec{r})|^2 \star \varphi(\vec{r}))(\vec{r}_p) \quad (23)$$

It is clear that, with this proposed integration step, one obtains a scalar field image that directly represents $\varphi(\vec{r})$, as already alluded to above.

EMBODIMENT 3

The linearity assumptions in image formation elucidated above can be represented in the model:

$$Q=AI \quad (24)$$

in which:
$I=I_1, I_2, \ldots, I_N)^T$ is the set of iVF images acquired by varying focus value;
$Q=(Q_1, Q_2, \ldots, Q_N)^T$ is a set of source images that are statistically de-correlated and that represent information coming from different depth layers (levels);
$A=(a_1, a_2, \ldots, a_N)^T$ is a square matrix transforming the original images into so-called principal components.

PCA decomposition obtains the factorization in equation (24) by finding a set of orthogonal components, starting with a search for the one with the highest variance. The first step consists in minimizing the criterion:

$$a_1 = \underset{\|a\|=1}{\operatorname{argmax}} E\{(a^T I)^2\} \quad (25)$$

The next step is to subtract the found component from the original images, and to find the next layer with highest variance.

At iteration $1 \leq k \leq N$, we find the kth row of the matrix A by solving:

$$a_k = \underset{\|a\|=1}{\operatorname{argmax}} E\left\{\left(a^T\left(I - \sum_{i=1}^{k-1} w_i w_i^T I\right)\right)^2\right\} \quad (26)$$

It can be shown (see, for example, literature references [1] and [3] referred to above) that successive layer separation can be achieved by using so-called Eigenvector Decomposition (EVD) of the covariance matrix $\Sigma_I$ of the acquired images:

$$\Sigma_I = E\{I^T I\} = EDE^T \quad (27)$$

in which:
E is the orthogonal matrix of eigenvectors of $\Sigma_I$;
$D=\operatorname{diag}(d_1, \ldots, d_N)$ is the diagonal matrix of Eigenvalues.
The principal components can then be obtained as $$Q=E^T I \quad (28)$$

The Eigenvalues are directly related to the variance of the different components:

$$d_i = (\operatorname{var}(Q_i))^2 \quad (29)$$

In cases in which noise plays a significant role, the components with lower weights (Eigenvalues) may be dominated by noise. In such a situation, the inventive method can be limited to the K (K<N) most significant components. The choice to reduce the dimensionality of the image data can be based on the cumulative energy and its ratio to the total energy:

$$r = \frac{\sum_{i=1}^{K} d_i}{\sum_{i=1}^{N} d_i} \quad (30)$$

One can choose a limit for the number of employed layers K based on a suitable threshold value t. A common approach in RCA dimensionality reduction is to select the lowest K for which one obtains $r \geq t$. A typical value for t is 0.9 (selecting components that represent 90% of the total energy).

Noise effects can be minimized by recombining several depth layers with a suitable weighting scheme. Additionally, re-weighting and recombination of layers can be useful to obtain an image contrast similar to the original images. In the previously described RCA decomposition, the strongest component (in terms of variance) is commonly associated with the background (matrix) material. Adding this component to depth layers enhances the visual appearance and information content of the obtained image. One can achieve the effect of boosting deeper-lying layers, reducing noise, and rendering proper contrast by re-scaling the independent components by their variances and reconstructing the highest-energy image using the rescaled components, as follows:

$$Q = ED^{-\frac{1}{2}}E^T I \qquad (31)$$

The skilled artisan will appreciate that other choices for the linear weighting of depth layers can also be used.

EMBODIMENT 4

As an alternative to the RCA decomposition set forth above, one can also employ an SS approach based on ICA. In ICA, one assumes a linear model similar to (24). The main difference with RCA is that one minimizes a higher-order statistical independence criterion (higher than the second-order statistics in RCA), such as so-called Mutual Information (MI):

$$MI(Q_1, \ldots, Q_N) = \sum_{i=1}^{N} H(Q_i) - H(Q) \qquad (32)$$

With marginal entropies computed as:

$$H(Q) = -\sum_{k=1}^{S} P(Q_i = q_k)\log(P(Q_i = q_k)) \qquad (33)$$

and the joint entropy:

$$H(Q) = \qquad (34)$$
$$-\sum_{k=1}^{S} P(Q_i = q_k, \ldots, Q_N = q_k)\log(P(Q_i = q_k, \ldots, Q_N = q_k))$$

in which:
P(Q) is the probability distribution of the imaging quantity Q;
$q_k$ is a possible value for said imaging quantity; and
S is the total number of scanned sites on the specimen (e.g. in the case of rectangular images, this is the product of height and width).

Other criteria—such as the so-called Infomax and Negentropy—can also be optimized in ICA decomposition. Iterative methods—such as FastICA—can be employed to efficiently perform the associated depth layer separation task. Adding more constraints to the factorization task can lead to more accurate reconstruction. If one adds the condition that sources (layers) render positive signals and that the mixing matrix is also positive, one moves closer to the real physical processes underlying image formation. A layer separation method based on such assumptions may use the so-called Non-Negative Matrix Decomposition (NNMD) technique with iterative algorithms.

For more information, see, for example, literature references [1] and [2] cited above.

The invention claimed is:

1. A method for imaging a specimen using a charged-particle microscope, comprising:
scanning the specimen with a charged particle beam at a plurality of focal depths, each of the plurality of focal depths includes a plurality of scan positions;
generating a vector field at each of the plurality of focal depths based on signals received from different segments of a detector at each scan position of the focal depth;
two-dimensionally integrating the vector field at each of the plurality of focal depths to form a vector field (iVF) image at each of the plurality of focal depths; and
deconvolving the iVF images at the plurality of focal depths into a set of depth-resolved images of the specimen.

2. The method of claim 1, wherein the vector field represents an electrostatic potential field gradient in the specimen.

3. The method of claim 1, wherein the iVF image represents an electrostatic potential field in the specimen.

4. The method of claim 1, wherein the specimen is non-magnetic.

5. The method of claim 1, wherein each of the plurality of iVF images is a linear sum of the set of depth-resolved images.

6. The method of claim 1, wherein the deconvolution is a linear transformation.

7. The method of claim 1, wherein the deconvolution is performed using a Source Separation algorithm.

8. The method of claim 7, wherein said Source Separation algorithm is selected from the group consisting Independent Component Analysis, Principal Component Analysis, Non-Negative Matrix Factorization, and combinations and hybrids hereof.

9. The method of claim 1, wherein the detector detects a flux of charged particles transmitted through the specimen.

10. The method of claim 1, wherein the charged-particle microscope is a transmission electron microscope.

11. A charged-particle microscope for imaging a specimen, comprising:
a source for directing a charged particle beam towards the specimen;
deflectors for scanning the specimen at a focal depth;
a segmented detector for receiving charged particles transmitted through the specimen; and
a controller configured to:
scan the specimen with the charged particle beam at a plurality of focal depths, each of the plurality of focal depths includes a plurality of scan positions;
generate a vector field at each of the plurality of focal depths based on signals received from different segments of the detector at each scan position of the focal depth;
two-dimensionally integrate the vector field at each of the plurality of focal depths to form a vector field (iVF) image at each of the plurality of focal depths; and
deconvolve the iVF images at the plurality of focal depths into a set of depth-resolved images of the specimen.

12. The charged-particle microscope of claim 11, wherein the vector field represents an electrostatic potential field gradient in the specimen.

13. The charged-particle microscope of claim 11, wherein the iVF image represents an electrostatic potential field in the specimen.

14. The charged-particle microscope of claim 11, wherein the specimen is non-magnetic.

15. The charged-particle microscope of claim 11, wherein each of the multiple iVF images is a linear sum of the set of depth-resolved images.

16. The charged-particle microscope of claim 11, wherein the deconvolution is a linear transformation.

17. The charged-particle microscope of claim 11, wherein the deconvolution is performed using a Source Separation algorithm.

18. The charged-particle microscope of claim 17, wherein said Source Separation algorithm is selected from the group consisting Independent Component Analysis, Principal Component Analysis, Non-Negative Matrix Factorization, and combinations and hybrids hereof.

* * * * *